(12) United States Patent
Imai et al.

(10) Patent No.: US 6,245,152 B1
(45) Date of Patent: Jun. 12, 2001

(54) METHOD AND APPARATUS FOR PRODUCING EPITAXIAL WAFER

(75) Inventors: Masato Imai; Masanori Mayusumi; Shinji Nakahara; Kazutoshi Inoue, all of Gunma (JP)

(73) Assignee: Super Silicon Crystal Research Institute Corp., Annaka (JP)

(*) Notice: Subject to any disclaimer, the term of this patent is extended or adjusted under 35 U.S.C. 154(b) by 0 days.

(21) Appl. No.: 08/885,904

(22) Filed: Jun. 30, 1997

(30) Foreign Application Priority Data

Jul. 5, 1996 (JP) .................................................. 8-194124
Aug. 6, 1996 (JP) .................................................. 8-221903

(51) Int. Cl.[7] ............................. C23C 16/00; H05H 1/00
(52) U.S. Cl. ......................... 118/728; 118/500; 118/719; 118/729; 156/345
(58) Field of Search .................................. 118/725, 726, 118/728, 729, 730, 500, 719, 733, 731, 715

(56) References Cited

U.S. PATENT DOCUMENTS

| | | | |
|---|---|---|---|
| 4,542,712 | * 9/1985 | Sato et al. ............................ | 118/728 |
| 5,288,379 | * 2/1994 | Namiki et al. ........................ | 118/719 |
| 5,584,936 | * 12/1996 | Pickering et al. .................... | 118/728 |
| 5,587,019 | * 12/1996 | Fujie .................................... | 118/725 |
| 5,837,058 | * 10/1998 | Chen et al. ........................... | 118/725 |

* cited by examiner

Primary Examiner—Gregory Mills
Assistant Examiner—P. Hassanzadel
(74) Attorney, Agent, or Firm—Evenson, McKeown, Edwards & Lenahan, P.L.L.C.

(57) ABSTRACT

A method and apparatus for forming an epitaxial layer on a semiconductor wafer supported on a suscepter in an epitaxial growth furnace. Ther wafer to be processed is placed on the suscepter outside the furnace. The suscepter carrying the wafer is transferred into the furnace from the outside thereof and mounted in a loading position within the furnace. An epitaxial growth process is then performed on the wafer on the suscepter mounted in the loading position. After the completion of the growth process, the suscepter carrying the wafer thereon is removed from the furnace loading position and transferred to the outside of the furnace.

11 Claims, 5 Drawing Sheets

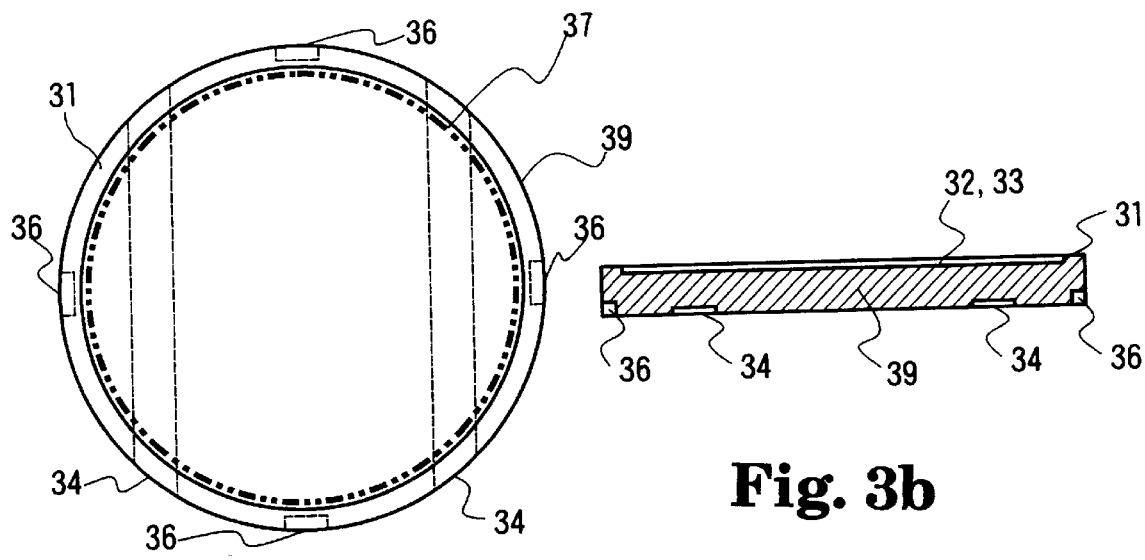
Fig. 3a
Fig. 3b
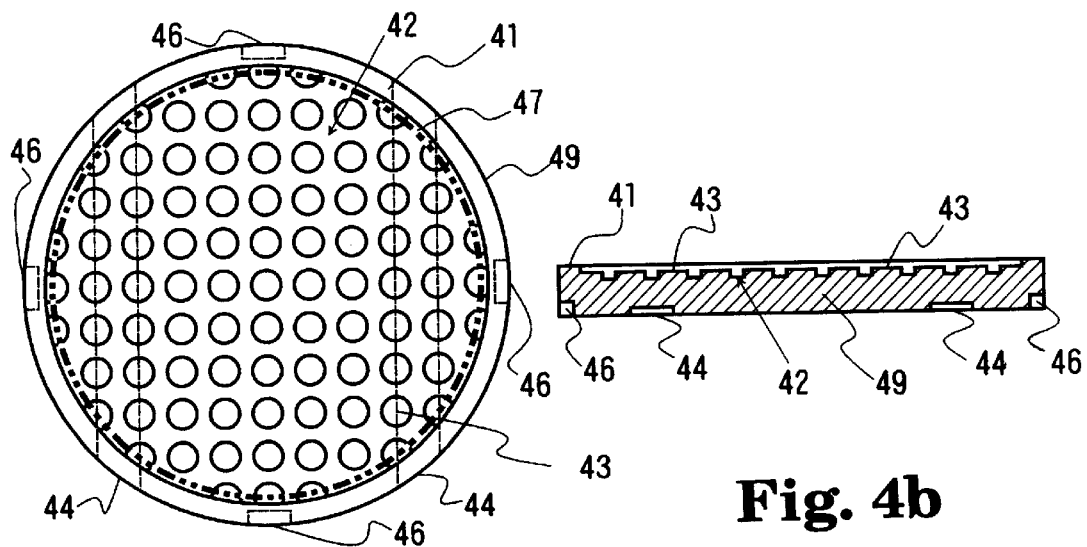
Fig. 4a
Fig. 4b

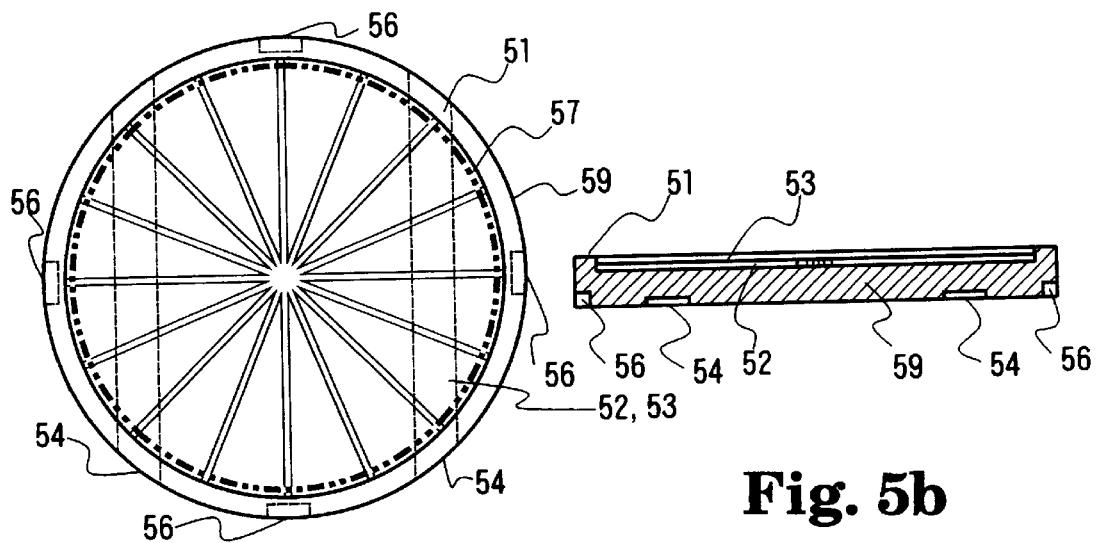
Fig. 5a
Fig. 5b
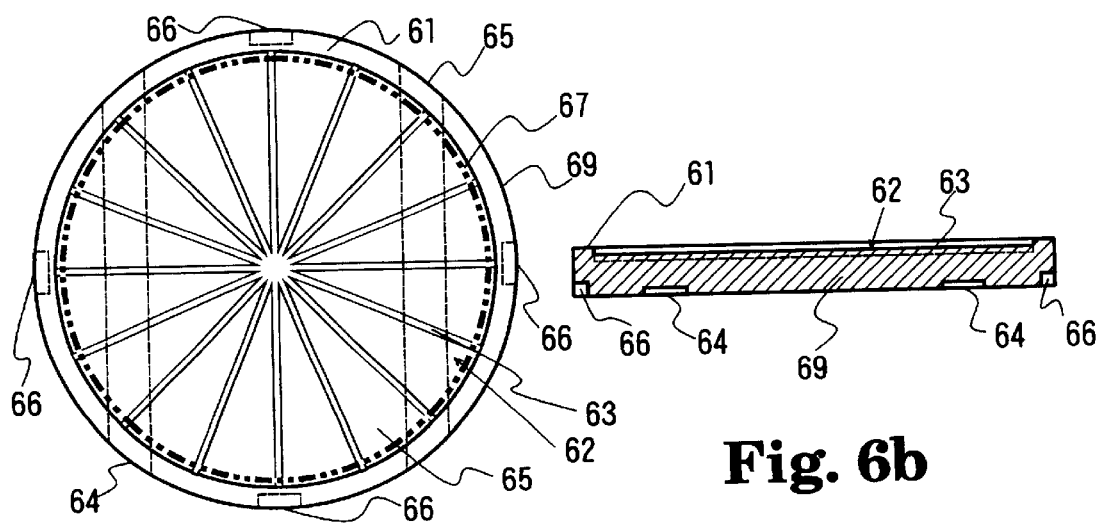
Fig. 6a
Fig. 6b

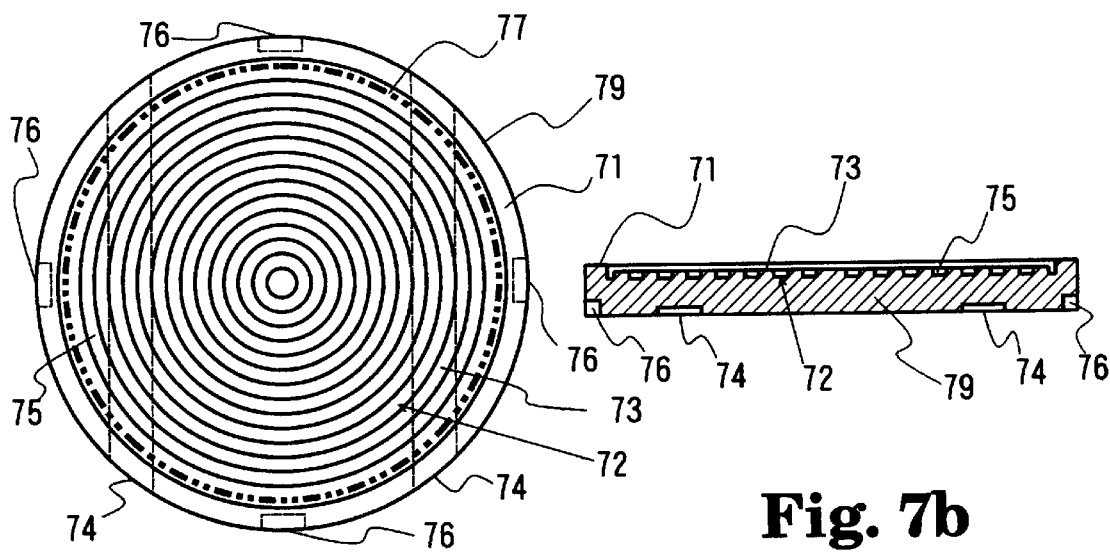
Fig. 7a
Fig. 7b
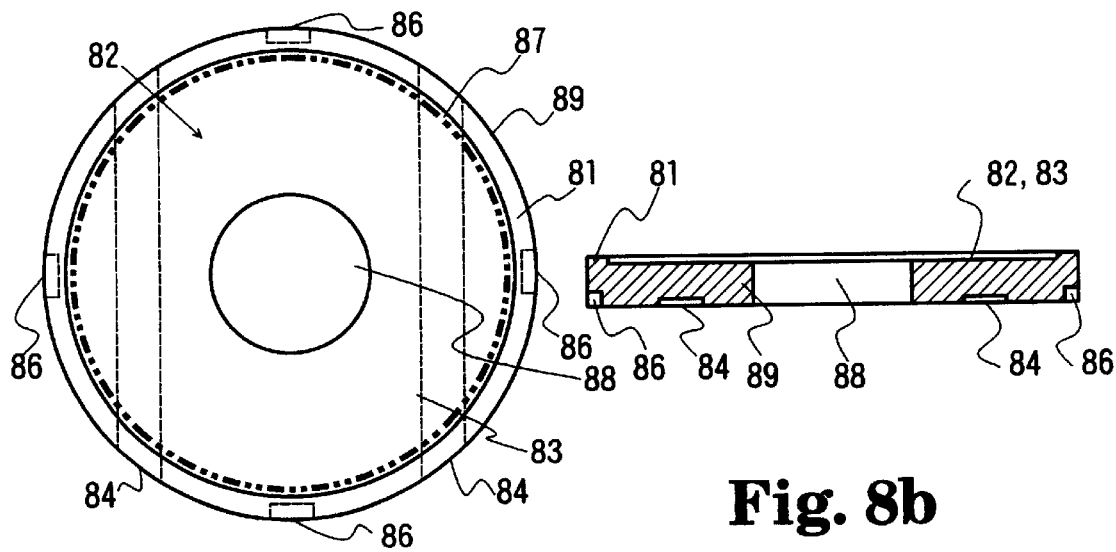
Fig. 8a
Fig. 8b

METHOD AND APPARATUS FOR PRODUCING EPITAXIAL WAFER

BACKGROUND OF THE INVENTION

1. Field of the Invention

The present invention relates to a method and apparatus for producing epitaxial wafers.

2. Related Background Art

It is known in the production of an epitaxial wafer that a semiconductor wafer sliced from a silicon crystal ingot is polished, cleaned and dried, immediately befor its growth process. The semiconductor wafer subjected to such preparatory process is transferred into an epitaxial growth furnace preheated to, for example, 700 to 800° C. and then it is loaded on a susceper made for example of silicon carbide or high purity carbon and arranged within the furnace. Thereafter, the furnace atmosphere is flushed with a growth atmosphere (hydrogen gas) and then the wafer is gradually heated to a higher temperature to thereby perform a pre-bake and, if necessary, a gas phase etching. During the growth process, a reaction gas containing silicon, e.g., $SiH_4$ or $SiHCl_3$ is injected into the interior of the epitaxial growth furnace and thus a silicon epitaxial layer is deposited by reduction or thermal decomposition on the surface of the wafer heated to an elevated temperature of about 1000° C. or over. In this case, the growth time for obtaining the required thickness of the epitaxial layer is adjusted in accordance with the relation between the predetermined growth rate and supply gas concentration. When the epitaxial layer is grown to the target thickness, the supply of the reaction gas is stopped so that the internal temperature of the furnace is gradually decreased and then the epitaxial wafer is removed from the furnace.

In the conventional production process of an epitaxial wafer, the wafer already subjected to the preparatory process is usually handled directly by a robot hand for its transfer into the epitaxial growth furnace. In other words, with the arm of the robot hand being in direct contact with the wafer, the wafer is transferred into the furnace and loaded onto the susceper from the robot hand within the furnace. In this case, the deposition of dust or dirt or the occurrence of flaw is caused by the contact between the wafer and the robot hand and it is pointed out that such dirt or flaw has the danger of causing the occurrence of such defect as the dislocation of crystal.

Also, during the transfer of the semiconductor wafer, the wafer is only partly supported by the robot hand and therefore it is said that particularly in the case of a large-diameter wafer the occurrence of distortion or deformation is caused in the wafer itself and this also tends to cause an ill effect on the epitaxial growth.

Further, when placing the wafer onto the susceper within the furnace, the susceper has already been heated to an elevated temperature and thus the wafer is rapidly heated locally at its portion contacting with the susceper. Such rapid transfer of heat from the susceper causes for example a local thermal degeneration of the wafer itself. On the other hand, there is caused nonuniformity in thermal effect between the portion of the wafer contacting with the susceper and the other portions and thus it is predicted that local variations in temperature distribution tend to cause defects within the wafer and there will be cases where such defects as cracks are caused in the wafer.

Recently, with the silicon semiconductor wafers (CZ wafers) supplied to the market, the tendency is towards increasing the diameter of wafers from those on the order of 200 mm towards on the order of 300 mm and projects are in progress towards realizing the production of 400 mm wafers or ultra large diameter wafers in the near future. Irrspectivee of the fact that such ultra large diameter wafers are over 4 time or so in area as compared with the ordinary wafers of the class which are 200 mm in diameter, the tendency is toward setting their thickness to a little over about 800 $\mu$m which is about the same with the ordinary wafers. This is due to the fact that if the ultra large diameter wafers of a thickness which is considerably large as compared with the thickness (about 725 $\mu$m) of the ordinary wafers, design changes are inevitably required for the various wafer processes and chip processes as well as the whole production processes of semiconductor devices by the existing equipment and therefore it is difficult to increase the strength of ultra large diameter wafers by increasing their thickness as compared with that of the existing wafers.

Thus, such ultra large diameter wafers are considerably low in strength as compared with the existing wafers and such deformations as strains and deflections due to gravity tend to be caused during their handling. In addition, when heat is externally applied, a longer time is required for the heat to be transmitted to the wafer on the whole so that as compared with the ordinary wafers, it tends to be greatly affected by the localized heating thus causing cracks and defects in the wafer due to the nonuniformheating. Also, since the ultra large diameter wafer is large in surface area and its area which contacts with a support for handling purposes or the like is also increased, the probability of the deposition of dust and dirt and the occurrence of flaws and the like which would have been neglected in the past is increased and they tend to cause further difficulties.

SUMMARY OF THE INVENTION

It is thus the primary object of the present invention to provide epitaxial wafer production method and apparatus applicable to the production of not only the ordinary sized epitaxial wafers on the order of 200 mm and 300 mm but also the production of epitaxial wafers of the order of 400 mm or over and a susceper well adapted for use with the said method and apparatus.

It is another object of the present invention to provide such method and apparatus so designed that thermal strain due to localized heating is not easily caused in a wafer during its loading into a growth furnace and simultaneously there is less danger of causing dirt, flaw, etc., in a wafer when moving it into and out of the growth furnace.

In accordance with a preferred aspect of the present invention there is thus provided a method for producing an epitaxial wafer, in which a semiconductor wafer is subjected to an epitaxial growth process on a susceper arranged within an epitaxial growth furnace, comprising the steps of:

placing a semiconductor wafer on a susceper outside the said furnace;

transferring the susceper, with the semiconductor wafer being supported thereon, into the furnace from the outside and mounting said susceper in a loading position within the furnace;

subjecting the semiconductor wafer to an epitaxial growth process on the susceper which is mounted in the loading position by said step of mounting; and removing, after the completion of the epitaxial growth process, the susceper carrying the semiconductor wafer thereon from the loading position within the furnace and transferring the same to the outside of the furnace.

According to this method, the step of placing the semiconductor wafer on the susceptor outside the furnace is preferably performed inside a clean chamber having its atmosphere replaced with a clean and high purity inert atmosphere and also this step may include a first step of placing a first semiconductor wafer on a first susceptor and a second step of placing a second semiconductor wafer on a second susceptor. In this case, the first susceptor carrying the first semiconductor wafer thereon and the second susceptor carrying the second semiconductor wafer thereon are temporarily stored in a waiting place and the first susceptor and/or the second susceptor are selectively transferred into the furnace. These waiting place and transfer path should also be located within a clean and high purity inert atmosphere.

According to the method of this invention, the semiconductor wafer already processed by the preparatory process is placed on a susceptor in a room temperature condition outside the furnace. Thereafter, with the wafer carried thereon, the susceptor is transferred from the outside into the furnace in a high temperature condition and the susceptor is mounted in a predetermined loading position within the furnace. When this occurs, the wafer is heated, along with the susceptor carrying it, to an elevated temperature gradually. Incidentally, the furnace atmosphere is flushed with a growth atmosphere (hydrogen gas) and a pre-bake as well as a gas phase etching, if necessary, are performed. During the following growth process, a reaction gas containing silicon such as $SiH_4$ or $SiHCl_3$ is injected into the epitaxial growth furnace so that a silicon epitaxial layer of the required thickness is deposited by reduction or thermal decomposition on the surface of the semiconductor wafer heated to an elevated temperature of over about 1000° C. After the epitaxial layer has grown to the target thickness, the supply of the reaction gas is stopped thereby gradually decreasing the furnace temperature and thereafter the susceptor carrying the wafer thereon is removed from the furnace. The susceptor removed from the furnace is transferred, along with the wafer subjected to the epitaxial growth process (the epitaxial wafer) and carried thereon, to a temporarily waiting place or the entrance of the following process (for example, a cleaning process or inspection process).

Thus, in accordance with the method of this invention, once a semiconductor wafer has been set on a susceptor outside a growth furnace, the semiconductor wafer is maintained in its supported condition on the susceptor in any of the following operations of transferring the wafer into the furnace, loading, heating and subjecting it to an epitaxial growth process and transferring it to the outside of the furnace and thus during this period the handling tools contact with the susceptor alone without the danger of directly contacting with the wafer. Thus, there is the advantage of practically eliminating the danger of causing the occurrence of flaws and the deposition of dirt on the wafer due to its handling during these operations.

In accordance with the present invention, it is needless to say that a susceptor for carrying a semiconductor wafer should preferably be of such form and structural strength which allow it to stably support the wafer without causing any distortion of the wafer and also the susceptor should preferably be of such structure, form and size having a minimum possible heat capacity from the standpoint of reducing the energy consumption since the susceptor is heated from the room temperature in the furnace upon each loading.

While any of the heretofore known various equipment of manual and automatic types can be used as the handling equipment for setting a semiconductor wafer on a susceptor outside a furnace, where ultra large diameter wafers are to be processed by the method of this invention, it is preferable to select one so that an ultra large diameter wafer can be transferred onto a susceptor stably and without causing any distortion in the wafer.

Also, it is possible to use a susceptor capable of carrying a plurality of wafers thereon and in this case it can be designed so that the plurality of wafers are transferred onto the susceptor one at a time or alternatively the plurality of wafer are transferred simultaneously.

When the susceptor carrying the semiconductor wafer thereon is transferred into the epitaxial growth furnace from the outside, the semiconductor wafer is maintained in a condition where its lower surface is stably supported by the susceptor and during this period only the susceptor comes into contact with the handling equipment. As a result, while being carried on the susceptor, the semiconductor wafer can be transferred without entirely coming into contact with the handling equipment and other structural members and without being transferred to another susceptor in the way and also it is possible to avoid the danger of flaws and the deposition of dirt on the wafer and the danger of causing bending, distortion and the like in the wafer due to additional handling.

The handling equipment for carrying the susceptor during its transfer and its mounting in a loading position within the furnace, should be constructed so as to carry the susceptor without causing the wafer thereon to come into direct contact with the handling equipment.

When transferring the wafer carried on the susceptor into the furnace, the interior of the epitaxial growth furnace is maintained, although due to the pre-heating, at a temperature considerably higher than the external room temperature and the loading portion for the mounting of the susceptor is also held at about the same high temperature as the furnace temperature. When, in accordance with the method of this invention, the susceptor carrying the semiconductor wafer thereon is transferred into the epitaxial growth furnace, the semiconductor wafer on the susceptor starts to be heated along with the susceptor transferred into the furnace simultaneously. In this case, although the susceptor contacting with the mount member within the furnace is inevitably heated locally under the heat transmitted from the mount member, the wafer on the susceptor is not brought into direct contact with the heated members within the furnace and thus it is not heated locally. In this way, the wafer is heated, along with the susceptor carrying it, uniformly throughout the whole surface at a relatively smooth heating rate by the furnace atmosphere and the radiant heat from the furnace heater, thereby avoiding both of the problem of rapid heating and the problem of local heating for the wafer.

It is to be noted that while, in this case, the susceptor is heated within the furnace thus increasing its temperature, the local heating of the susceptor at its portion contacting with the furnace mount member is dispersed within the susceptor and thus the local heating dose not reach the wafer.

The pre-bake and epitaxial growth process within the furnace are performed while maintaining the stably carried condition of the wafer on the susceptor and during this interval the furnace members other than the susceptor do not contact with the wafer. Therefore, there is no danger of causing any local temperature gradient in the wafer and also the supporting condition of the wafer is not changed thereby avoiding the occurrence of inconvenient distortions and bending.

When an epitaxial layer of the target thickness is formed on the surface of the wafer, the inner temperature of the furnace is decreased and the wafer is eventually removed from the furnace, whereas in accordance with the method of this invention even at this time the handling equipment is not brought into direct contact with the wafer so that the suscepter carrying the wafer thereon is removed or dismounted from the loading position by the handling equipment and it is further transferred to the outside of the furnace. Thus, in accordance with the method of this invention, during the interval between the transfer of the wafer into the furnace and the removal of the wafer to the outside of the furnace, the wafer remains carried on the suscepter thus keeping the supporting condition of the wafer unchanged during the interval and also, excepting the suscepter, the handling equipment as well as the inner and outer members of the furnace do not contact with the wafer.

When processing ultra large diameter wafers, particularly those of over 400 mm in diameter according to the method of this invention, the suscepter used should preferably be made of a material having a high strength and high heat conduction properties. For example, a suscepter made of a single substance or composite material of high purity carbon, hard graphite, silicon carbide, silica, etc., can be suitably used with the method of this invention.

Also, while the epitaxial growth furnaces usable with the method of this invention include various types of furnaces, the present invention is not particularly limited to the type of any growth furnace provided that it is of such construction that a suscepter carrying a semiconductor wafer thereon can be removably mounted in a loading position within the furnace. For instance, the epitaxial growth furnaces of various furnace types such as single wafer reactors, horizontal furnaces, vertical furnaces (disc type furnaces), barrel type furnaces, etc., can be used with the method of this invention.

In accordance with the present invention there is further provided an apparatus for producing an epitaxial wafer, in which a semiconductor wafer is subjected to an epitaxial growth process on a suscepter arranged within an epitaxial growth furnace.

In other words, according to another aspect of the present invention, said apparatus comprises:
  an epitaxial growth furnace including a mount mechanism for removably holding a suscepter in a furnace loading position and gate means adapted to be opened and closed for allowing the passage of a suscepter carrying a semiconductor wafer thereon;
  means for transferring said suscepter carrying the semiconductor wafer thereon to said furnace loading position from outside said furnace and vice versa; and
  handling means for mounting said suscepter carrying the semiconductor wafer thereon to the mount mechanism in the furnace loading position and dismounting the same therefrom.

In accordance with a preferred aspect of the present invention, said apparatus further comprises means for storing said suscepter carrying thereon the semiconductor wafer to be subjected to the epitaxial growth process into a waiting place at a predetermined position, and the suscepter carrying the semiconductor wafer thereon is transferred into the furnace from the waiting place by the transfer means.

In accordance with another preferred aspect of the present invention, said apparatus further comprises means for storing said suscepter carrying thereon the semiconductor wafer processed by the epitaxial growth process into a predetermined temporary storage place, and the suscepter carrying the semiconductor wafer thereon is transferred into the temporary storage place from inside the furnace by the transfer means.

In accordance with still another preferred aspect of the present invention, the handling means comes into contact with only the suscepter carrying the semiconductor wafer thereon and holds it.

In accordance with still another preferred aspect of the present invention, the handling means is carried on the transfer means.

In accordance with still another preferred aspect of the present invention, the suscepter includes at least one support having a flat top surface adapted to contact and support the lower surface of the semiconductor wafer.

With the apparatus according to the present invention, the transfer of a wafer into the growth furnace, the mounting of the wafer in the furnace loading position, the performance of an epitaxial growth process on the wafer within the growth path, the removing or dismounting of the processed wafer from the loading position within the growth furnace and the transfer of the processed wafer from inside the furnace are all performed while the wafer is being carried on the suscepter. As a result, the supporting condition of the wafer remains unchanged and maintained stably throughout the operations, and there is no danger of the wafer being contacted with the handling tools and the members of the apparatus.

While, as the means of transferring the suscepter carrying the semiconductor wafer thereon into the furnace loading position from outside the epitaxial growth furnace or vice versa, it is possible to use, for example, a robot arm adapted to contact only a suscepter and carry it directly so as to transfer a wafer together with the suscepter into and out of the growth furnace, the present invention is not limited thereto.

In addition, such robot arm can be concurrently used as the handling means whereby the suscepter carrying the semiconductor wafer thereon is attached to or removed from the mount mechanism at the furnace loading position.

When the wafer carried on the suscepter is transferred into the epitaxial growth furnace, the furnace temperature has already been elevated. As a result, the furnace mount members, etc., have also been elevated in temperature in the furnace loading position where the suscepter carrying the semiconductor wafer thereon is to be mounted. In the apparatus of this invention, only the suscepter comes into contact with these high temperature furnace members and the wafer carried on the suscepter is not brought into contact with these high temperature furnace members.

The suscepter is designed so that not only a semiconductor wafer is supported from its lower surface in the predetermined loading position within the epitaxial growth furnace throughout the epitaxial growth process within the furnace but also the suscepter supports the wafer in transfer outside the furnace as well as during the mounting and dismounting from the loading position within the furnace.

Thus, in accordance with a preferred aspect of the present invention, the suscepter includes:
  a mount structure which is removably attachable to the loading position within the furnace,
  a holding structure adapted to be transferred by the transfer means between the inside and outside the furnace while carrying a semiconductor wafer thereon, and
  a support having a top surface adapted to contact and support the lower surface of the semiconductor wafer.

In accordance with another preferred aspect of the present invention, the suscepter has an annular external shape with a hole in the central portion.

In accordance with still another preferred aspect of the present invention, the support of the suscepter includes a flat top surface for contacting with the whole area of the lower surface of the wafer.

In accordance with still another preferred aspect of the present invention, the support of the suscepter has a top surface including concentrical or spiral projections of a substantially circular shape.

In accordance with still another preferred aspect of the present invention, the support of the suscepter has a top surface including a plurality of projections which contact with only a part of the lower surface of the wafer and the heights of these projections are uniform within a flat plane.

In this case, it is desirable that the plurality of projections are arranged so as to be separated from each other to contact with the lower surface of the wafer with a substantially uniform distribution. More specifically, such plurality of projections can be formed as a plurality of projections which extend radially or a plurality of sector projections defined by radially extending grooves.

In accordance with the present invention, there is no particular limitation to the external shape and dimensions of the suscepter. It is only necessary that the suscepter includes a support capable of stably supporting a single or plurality of semiconductor wafers, that is, the required number of such wafers and a mount structure that fits to the mount member within the growth furnace. For instance, while, in the case of a disc-type or barrel-type furnace, the suscepter is supported on a rotary shaft and rotated so as to allow the reaction gas to uniformly contact with the wafer surface, in such case the suscepter is only required to have a structure such that the suscepter is removably mounted on the rotary shaft and adapted for rotary motion by the shaft.

The above and other features and advantages of the present invention will be understood more apparently from the following preferred embodiments shown simply for illustrative purposes without any intention of limitation when taken in conjunction with the accompanying drawings.

BRIEF DESCRIPTION OF THE DRAWINGS

FIGS. 3a and 3b show respectively a plan view and a sectional view of a suscepter according to an embodiment of the present invention.

FIGS. 4a and 4b show respectively a plan view and a sectional view of a suscepter according to another embodiment of the present invention.

FIGS. 5a and 5b show respectively a plan view and a sectional view of a suscepter according to still another embodiment of the present invention.

FIGS. 6a and 6b show respectively a plan view and a sectional view of a suscepter according to still another embodiment of the present invention.

FIGS. 7a and 7b show respectively a plan view and a sectional view of a suscepter according to still another embodiment of the present invention.

FIGS. 8a and 8b show respectively a plan view and a sectional view of a suscepter according to still another embodiment of the present invention.

DESCRIPTION OF THE PREFERRED EMBODIMENTS

Figure 1:
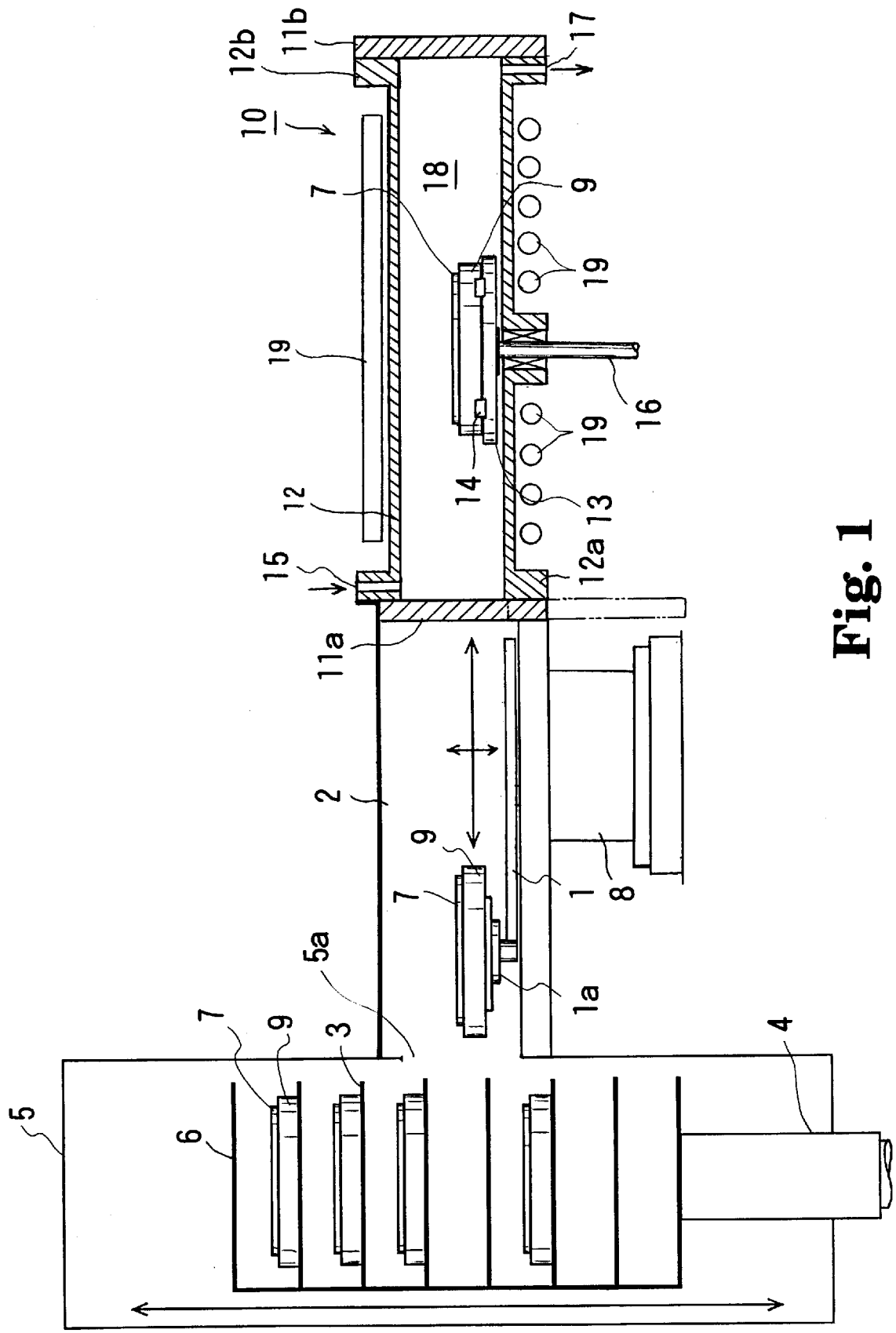
FIG. 1 shows schematically the construction of an epitaxial wafer manufacturing apparatus according to an embodiment of the present invention.

As shown in FIG. 1, an epitaxial wafer manufacturing apparatus according to the present invention includes a load lock chamber 5 serving as storage means for storing a plurality of suscepters 9 each carrying a wafer 7 thereon, an epitaxial growth furnace 3, and a multi-spindle robot 8 including a robot arm 1 for serving as transfer means adapted to transfer the suscepters 9 between the load lock chamber 5 and the growth furnace 3. Also, a robot hand 1a serving as handling means is provided at the forward end of the robot arm 1. These robot arm 1 and robot hand 1a are arranged within a clean chamber 2 which purges the space between the load lock chamber 5 and the growth furnace 3 with clean nitrogen.

The load lock chamber 5 is provided with an elevator shaft 4 in its lower part, and the interior of the chamber 5 is purged with clean nitrogen. A multi-stage carrier 6 is removably mounted at the end of the elevator shaft 4 within the chamber 5. The carrier 6 includes a plurality of shelves 3 forming a vertical multi-stage structure. Also, the load lock chamber 5 communicates with the clean chamber 2 through an opening 5a through which the robot arm 1, the robot hand 1a and the suscepter 9 (a wafer 7 is placed on it) gripped by the hand can pass, and each of the shelves 3 of the carrier 6 is opened at its front side facing the opening 5a. Also, the shelves 3 can be selectively caused to face the opening 5a by the vertical movement of the elevator shaft 4.

With the present embodiment, a semiconductor wafer which has undergone a wafer preparation process including the polishing, cleaning and drying, is placed on each suscepter 9 at a separate location which is not shown, that is, outside the growth furnace 3 prior to the epitaxial growth process. In this way, the plurality of suscepters 9 each carrying an unprocessed wafer 7 thereon are respectively stored on the shelves 3 of the carrier and the carrier 6 is replaceably mounted on the elevator shaft 4 in the load lock chamber 5. Thereafter, as will be described later, the suscepter 9 of each shelf 3 is removed, together with the wafer 7 placed thereon, from the shelf 3 by the robot hand 1a and it is then transferred into the growth furnace 10 through the clean chamber 2 by the robot arm 1. The suscepter 9 having placed thereon the wafer 7 which has been processed and transferred back from within the growth furnace 10 by the robot arm 1 is again stored on the empty shelf 3 as will be described later. When all the shelves 3 have been occupied by the suscepters carrying the processed wafers thereon, the carrier 6 is removed from the elevator shaft 4 and sent to another place, e.g., a cleaning process or inspection process from the load lock chamber 5.

The multi-spindle robot 8 performs the respective operations of loading the suscepter 9 carrying the wafer 7 on it onto the robot arm 1 from the load lock chamber 5 or the growth furnace 10 by the robot hand 1a, or alternatively delivering it from the robot arm 1 to the load lock chamber 5 or the growth furnace 10 by the robot hand 1a, thereby transferring the suscepter 9 carrying the wafer 7 thereon between the load lock chamber 5 and the growth furnace 10 by the robot arm 1. The robot hand 1a is so designed that during these operations the robot hand 1a dose not directly contact with the wafer 7 on the suscepter 9 and therefore the robot hand 1a comes into direct contact only with the suscepter 9 during the handling and transfer.

While, in the present embodiment, the epitaxial growth furnace 10 is of the single wafer type where a single wafer of a relatively large diameter is subjected to the epitaxial growth process in each epitaxial growth operation, the present invention is not limited to this type. The growth furnace 10 includes a quartz vessel 12 having a water-cooled front flange 12a and a water-cooled rear flange 12b which are each formed with an opening. A gate 11a adapted to open and close so as to define the boundary between it and the clean chamber 2 is attached to the opening of the front flange 12a. On the other hand, the rear flange 12b is designed so that it can be closed by a removable cover 11b and used as a rear maintenance port. The interior of the closed vessel 12 is utilized as a reaction chamber 18 for the epitaxial growth process. The front flange 12a is provided with a gas injector port 15 so as to introduce a purge gas or reaction gas into the reaction chamber 18 and the rear flange 12b is provided with a gas vent port 17, so that the gas introduced from the injector port 15 flows as a laminar flow within the reaction chamber 18 and discharged from the vent port 17. Of course, it is needless to say that a gas supply system and a vent controller, which are not shown, are connected to the injector port 15 and the vent port 17, respectively, by piping.

Arranged at a given loading position within the reaction chamber 18 of the growth furnace 10 is a susceptor holder disk 13 which is rotatable at a controlled rotation speed through a rotary shaft 16 from an external driving source (not shown). The disk 13 is provided on its upper surface with a plurality of chucks 14 forming a mount mechanism for removably holding a susceptor 9, and the susceptor 9 is clamped at a plurality of locations on its periphery and stably held on the disc 13. It is to be noted that the clamping and unclamping operations of the chucks 14 are performed when the robot hand 1a arrives at a predetermined position relative to the disk 13 and these operations are effected by the robot hand 1a itself or by a separate remote controller.

The growth furnace 10 is provided with a plurality of infrared heaters 19 consisting for example of halogen lamps which are arranged on the upper and lower sides of the reaction chamber 18, and the interior of the reaction chamber 18 is heated by the infrared heaters 19. It is to be noted that though not shown, a plurality of heat sensors for feeding back temperature information are also arranged inside the reaction chamber 18 and the temperature information is utilized to control the temperature distribution within the reaction chamber 18 for every plurality of zones, for example.

Usually, the interior of the reaction chamber 18 of the growth furnace 10 has already been purged with nitrogen and preheated to about 700 to 800° C. by the time that the susceptor 9 carrying the wafer 7 to be processed is introduced through the gate 11a by the robot arm 1 and the robot hand 1a. Thereafter, the susceptor carrying the wafer thereon is transferred onto the disk 13 by the robot hand 1a and the chucks 14 are operated thereby completing its mounting to the loading position. Then, the robot arm 1 and the hand 1a are retreated into the clean chamber 2 through the gate 11a and the gate 11a is closed, thereby performing as occasion demand a pre-bake process including gas phase etching.

Then, a reaction gas ($SiHCl_3$, for example) is injected into the chamber 18 through the injector port 15 and the power output of the heaters 19 is increased to heat the interior of the chamber 18 to an epitaxial reaction temperature, e.g., about 1100 to 1200° C. As a result, an epitaxial layer is grown on the surface of the wafer 7 by the reduction and thermal decomposition action of the reaction gas.

When the epitaxial layer of the target thickness is grown on the surface of the wafer 7, the venting and lowering of the temperature to the pre-heating temperature are effected in the reaction chamber 18. Thereafter, the gate 11a is opened again and the robot arm 1 and the robot hand 1a are moved into the chamber 18 through the gate 11a. Thus, the chucks 14 of the disk 13 are disengaged and the susceptor 9 is unclamped, thereby holding on the robot hand 1a the susceptor 9 carrying the processed wafer 7 thereon. The susceptor carrying the processed wafer thereon is transferred from inside the reaction chamber 18 to the clean chamber 2 and it is further transferred to just this side of the opening 5a of the load lock chamber 5. The carrier 6 is waiting inside the load lock chamber 5 such that the empty shelf 3 faces the opening 5a and thus the susceptor 9, which has been transferred to the position of the opening 5a by the robot arm 1, is stored on the empty shelf 3 of the carrier 6 while carrying the processed wafer 7 thereon.

An example of a process for producing an epitaxial wafer by using the manufacturing apparatus shown in FIG. 1 will now be explained in a time sequential manner.

Figure 2:
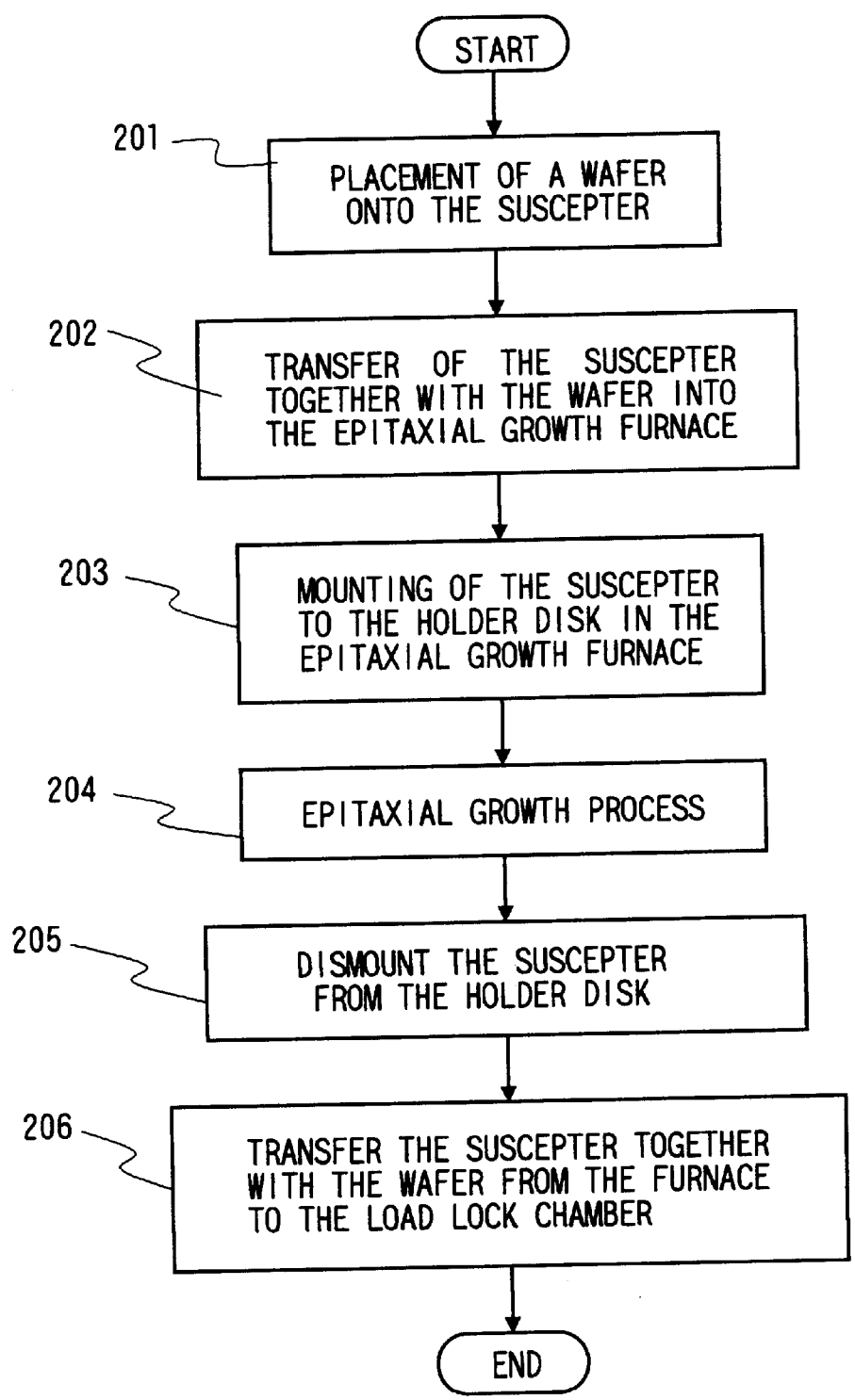
FIG. 2 shows the process flow of epitaxial wafer production according to an embodiment of the present invention.

FIG. 2 shows the process flow of the epitaxial wafer production according to the present embodiment. In FIG. 2, at the first step 201, a semiconductor wafer 7 which has preliminarily undergone a wafer preparation process including the polishing, cleaning and drying, is properly placed on a susceptor 9 in the room temperature condition of the clean chamber outside the growth furnace 10. A plurality of such susceptors 9 each carrying a wafer 7 thereon are successively prepared, and these susceptors are successively stored on the respective shelves 3 of the carrier 6, thereby preparing in the clean environment outside the growth furnace 10 the carrier 6 in which the susceptor 9 carrying the wafer 7 thereon is stored on each of the plurality of shelves 3. The carrier 6 is then mounted on the end of the elevator shaft 4 within the load lock chamber 5, and in response to the vertical movement of the elevator shaft 4 the shelf 3 selected for the next step is lifted to the level of the position which is opposite to the opening 5a.

At the next step 202, the hand 1a is advanced into the load lock chamber 5 through the opening 5a by the robot arm 1 and the susceptor 9 (the wafer 7 is still placed thereon) on the preliminarily selected shelf 3 facing the opening 5a is held by the hand 1a. The susceptor 9 carrying the wafer 7 thereon and held on the hand 1a, is introduced as such into the clean chamber 2 by the robot arm 1 and during this period the gate 11a of the growth furnace 10 is opened. The carrier 6 will not be moved until the wafer 7 placed on the susceptor 9 is subjected to the epitaxial growth process and returned together with the susceptor 9 to the original and the same shelf 3. The susceptor 9 is further transferred into the growth furnace 10 through the gate 11a and positioned just above the holder disk 13. At this time, the reaction chamber 18 of the growth furnace 10 has been purged with nitrogen and the internal temperature of the chamber 18 has also reached the pre-heat temperature.

At a step 203, in order that the susceptor 9 held on the robot hand 1a and waiting just above the disk 13 may be properly clamped by the chucks 14, adjustment in the position of the susceptor 9 by the robot arm 1 and adjustment in the orientation of the disk 13 by the rotary shaft 16 are effected. After the completion of these adjustments, the susceptor 9 is softly mounted on the disk 13 through the operation of the robot arm 1 and the hand 1a and the susceptor 9 is clamped by the chucks 14 on the disk 13. Thus, the susceptor 9 carrying the wafer 7 thereon is mounted at a given loading position in the furnace and thus the wafer 7 starts, together with the susceptor 9 supporting it, to be heated gradually within the reaction chamber 18. The robot arm 1 is retreated, together with the robot hand 1a, to the outside of the reactor chamber 18 through the gate 11a and waits or stands by in the clean chamber 2. Then, the gate 11a is closed and the reaction chamber 18 is closed.

At a step 204, hydrogen gas is first introduced into the reaction chamber 18 through the gas injection port 15 and simultaneously the nitrogen gas in the chamber is discharged through the vent port 17, thereby flushing it with the hydrogen gas in the reaction chamber 18.

In this condition, the disk 13 is rotated at a controlled rotation speed by the rotary shaft 16 and the wafer 7 is subjected to a pre-bake as well as a gas phase etching in case of need. Then, such reaction gas as $SiH_4$ or $SiHCl_3$ for epitaxial growth purposes is injected into the reaction chamber 18 via the injection port 15 and simultaneously the gas in the chamber is discharged through the vent port 17, thus adjusting the flow rates of these injected and discharged gases and thereby causing the reaction gas to flow so as to form a laminar flow on the rotating wafer surface. Consequently, a silicon epitaxial layer of the required thickness is deposited by reduction or thermal decomposition on the surface of the wafer heated to an elevated temperature of about 1000° C. or over. When the epitaxial layer is grown to the target thickness, the supply of the reaction gas is stopped and the rotation of the disk 13 is stopped, thereby gradually decreasing the temperature in the reaction chamber 18.

At a step 205, the gas in the reaction chamber 18 is flushed with nitrogen and the gate 11a is opened when the chamber temperature is decreased near to a sufficiently stable temperature. Then, the robot arm 1 waiting in the clean chamber 2 is advanced, together with the hand 1a, to the position of the disk 13 in the reaction chamber 18 through the opened gate 11a. Then, the chucks 14 are unclamped by the hand 1a by the reverse procedure to the previously mentioned clamping operation and the susceptor 9 carrying the wafer 7 thereon is transferred from the disk 13 onto the hand 1a.

At a step 206, as the robot arm 1 is retreated, the susceptor 9 carrying the wafer 7 thereon and held by the hand 1a is transferred as such into the clean chamber 2 from the reaction chamber 18 by the retreatment of the robot arm 1. The susceptor 9 transferred into the clean chamber 2 is returned, along with the wafer 7 processed by the epitaxial growth process (epitaxial wafer) carried thereon, to the starting position or the original shelf 3 by the robot arm 1 and the hand 1a through the course reverse to that mentioned previously.

In this way, the epitaxial growth process is performed on the wafer 7 of each shelf 3 so that when all the wafers 7 of the plurality of shelves in the carrier 6 become epitaxial wafers, the carrier 6 is removed from the elevator shaft 4 and transferred to the following process, e.g., the cleaning process or inspection process.

It is to be noted that while, in the present embodiment, the susceptors 9 preliminarily carrying the wafers 7 thereon are stored in the carrier 6, it is possible to use a wafer cartridge storing only a plurality of wafers in place of the carrier 6 so that when the wafer is withdrawn from the cartridge by a wafer handling device, the wafer is placed on an empty susceptor which is held by the robot hand 1a and waiting outside the reaction chamber. In this case, it is desirable that the susceptor is cleaned during each interval between the respective epitaxial growth processing steps, and this permits repeated use of the single susceptor for a number of times of the epitaxial growth process.

FIGS. 3a and 3b to FIGS. 8a and 8b show some embodiments of the susceptor well suited for use with the present invention.

A susceptor 39 according to the embodiment of FIGS. 3a and 3b is substantially disk-shaped on the whole and its wafer support 32 is practically occupied by a flat top surface 33 which contacts with the back surface of a wafer 37 substantially over its whole area; and the peripheral edge of the support 32 is surrounded by an edge bank 31 to prevent horizontal shift of the wafer 37. The bottom surface of the susceptor 39 is formed with a pair of parallel grooves 34 for receiving the robot hand 1a as a holding structure for transferring purposes. Thus, the susceptor 39 carrying the wafer 37 thereon is held and transferred by the robot hand 1a received in the grooves 34. Also, the outer peripheral surface of the susceptor 39 is provided with a plurality of recesses 36 at equal circumstantial intervals. These recesses 36 respectively engage with the plurality of chucks 14 of the holder disk 13 to form a mount structure which removably mount the susceptor 39 on the disk 13.

A susceptor 49 according to the embodiment of FIGS. 4a and 4b has a wafer support 42 formed by the top surfaces of a plurality of projections 43 and a wafer 47 is supported by the top surfaces of the projections 43 which partially contact with the back surface of the wafer. The peripheral edge of the support 42 is surrounded by an edge bank 41 for preventing horizontal shift of the wafer 47. The plurality of projections 43 having a cylindrical shape of the same height are arranged in a substantially uniform distribution on the inner side of the edge bank 41. There is no limitation to the dimensions and planar shape of the projections 43 provided that they are all of the same height. The bottom surface of the susceptor 49 is formed, as a holding structure for transferring purposes, with a pair of parallel grooves 44 for receiving the robot hand 1a. As a result, the susceptor 49 carrying the wafer 47 thereon is held and transferred by the robot hand 1a received in the grooves 44. Also, the outer peripheral surface of the susceptor 49 is provided with a plurality of recesses 46 at equal circumstantial intervals. These recesses 46 respectively engage with the plurality of chucks 14 of the holder disk 13 to form a mount structure for removably mounting the susceptor 49 on the disk 13.

A susceptor 59 according to the embodiment of FIGS. 5a and 5b has a wafer support 52 formed by the top surfaces of a plurality of sectors 53 which are arranged radially substantially from its center, and the back surface of the wafer 57 is brought into partial contact with the top surfaces of the sectors 53 which support it. The peripheral edge of the wafer support 52 is surrounded by an edge bank 51 for preventing horizontal shift of the wafer 57. The bottom surface of the susceptor 59 is formed, as a holding structure for transferring purposes, with a pair of parallel grooves 54 for receiving the robot hand 1a. Thus, the susceptor 59 carrying the wafer 57 thereon is held and transferred by the robot hand 1a received in the groove 54.

Contrary to the case of FIG. 5, a susceptor 69 according to FIGS. 6a and 6b has a wafer support 62 provided by the top surfaces of a plurality of projections 63 arranged radially from substantially its center and the back surface of the wafer 67 is brought into partial contact with the top surfaces of the projections 63 and supported. A recess 65 of lower level than the projections 63 is formed between the respective projections 63. The peripheral edge of the wafer support 62 is enclosed by an edge bank 61 for preventing horizontal shift of the wafer 67. The bottom surface of the susceptor 69 is provided, as a holding structure for transferring purposes, with a pair of parallel grooves 64 for receiving the robot hand 1a. Thus, the susceptor 69 carrying the wafer 67 thereon is held and transferred by the robot hand 1a received in the grooves 64. Also, the outer peripheral surface of the susceptor 69 is provided with a plurality of recesses 66 spaced at equal circumferential intervals. These recesses 66 respectively engage with the plurality of chucks 14 of the holder disk 13 to form a mount structure for removably mounting the susceptor 69 on the disk 13.

A susceptor 79 according to the embodiment of FIGS. 7a and 7b has a wafer support 72 provided by the top surfaces of a plurality of concentrical (may be spiral) protruding rings 73 so that the back surface of a wafer 77 is brought into partial contact with the top surface of the protruding rings 73 and supported. A recess 75 of lower level than the protruding rings 73 is formed between the respective protruding rings 73. The peripheral edge of the wafer support 72 is surrounded by an edge bank 71 for preventing horizontal shift of the wafer 77. The bottom surface of the susceptor 79 is provided, as a holding structure for transferring purposes, with a pair of parallel grooves 74 for receiving the robot hand 1a. Thus, the susceptor 79 carrying the wafer 77 thereon is held and transferred by the robot hand 1a received in the grooves 74. Also, the outer peripheral surface of the susceptor 79 is provided with a plurality of recesses 76 spaced at equal circumferential intervals. The recesses 76 respectively engage with the plurality of chucks 14 of the holder disk 13 to form a mount structure for removably mounting the susceptor 79 on the disk 13.

A susceptor 89 according to the embodiment of FIGS. 8a and 8b has a ring shape including a hole 88 through substantially its central portion and its wafer support 82 is provided by a flat annular top surface 83 surrounding the hole 88. The back surface of a wafer 87 is brought into contact with the annular top surface 83 and supported. The peripheral edge of the wafer support 82 is surrounded by an edge bank 81 for preventing horizontal shift of the wafer 87. The bottom surface of the susceptor 89 is provided, as a holding structure for transferring purposes, with a pair of parallel grooves 84 for receiving the robot hand 1a. Thus, the susceptor 89 carrying the wafer 87 thereon is held and transferred by the robot hand 1a received in the grooves 84. Also, the outer peripheral surface of the susceptor 89 is provided with a plurality of recesses 86 spaced at equal circumferential intervals. The recesses 86 respectively engage with the plurality of chucks 14 of the holder disk 13 to form a mount structure for removably mounting the susceptor 89 on the disk 13. The susceptor 89 has the advantage of realizing the reduction in weight owing to the formation of the hole 88.

It is to be noted that while the suscepters having the circular external shapes have been described in connection with the above embodiments, the present invention is not limited thereto and suscepters of various ring and disk shapes for weight reducing purposes can also be used with the invention. Also, as regards the epitaxial growth furnace, it is needless to say that the present invention is not limited to the type shown in FIG. 1 and it is possible to use other horizontal furnaces, disk type furnaces, barrel type furnaces, etc., of various types. Further, while in the apparatus of the previously mentioned embodiment, both the suscepters carrying the unprocessed wafers and the suscepters carrying the processed wafers are present simultaneously in the carrier 6 arranged in the load lock chamber 5, it is possible to respectively store the unprocessed and processed wafers in separate carriers and it is also possible to respectively accommodate these separate carriers in separate clean chambers.

What is claimed is:

1. A susceptor for supporting a semiconductor wafer at a lower surface thereof in a predetermined loading position within an epitaxial growth furnace throughout an epitaxial growth process, wherein said susceptor has an annular ring shape formed with a central hole for realizing the weight reduction thereof and an annular support surrounding said hole for supporting the lower surface of the semiconductor wafer, and wherein said support includes one or more circular projections in concentric or spiral form, a top surface of each of said projections being adapted to contact with only a part of the lower surface of the semiconductor wafer, said projections being uniform in height within a flat plane to support the lower surface of the semiconductor wafer.

2. A susceptor for supporting a semiconductor wafer at a lower surface thereof in a predetermined loading position within an epitaxial growth furnace throughout an epitaxial growth process, comprising:

a mount structure adapted to be transferred, while supporting a semiconductor wafer, between the inside and outside of said furnace by transfer means, and a support having a top surface adapted to contact with and support the lower surface of said semiconductor wafer;

wherein the top surface of said support includes a plurality of projections each adapted to contact with only a part of the lower surface of said wafer, and wherein said projections are uniform in height within a flat plane.

3. A susceptor according to claim 2, wherein said plurality of projections are separately arranged from each other so as to contact with the lower surface of said wafer in substantially equal distribution.

4. A susceptor according to claim 2, wherein said plurality of projections include a plurality of radially extended ridges.

5. A susceptor according to claim 2, wherein said plurality of projections include a plurality of sector projections partitioned by a plurality of radially extended grooves.

6. A susceptor according to claim 2, wherein each of said plurality of projections has a cylindrical shape of the same height, a top surface of each of said projections being adapted to contact with only a part of the lower surface of the semiconductor wafer.

7. A susceptor for supporting a semiconductor wafer at a lower surface thereof in a predetermined loading position within an epitaxial growth furnace throughout an epitaxial growth process, comprising a support having a top surface adapted to contact with and support the lower surface of said semiconductor wafer, wherein the top surface of said support includes a plurality of projections each adapted to contact with only a part of the lower surface of said wafer, and wherein said projections are uniform in height within a flat plane.

8. A susceptor according to claim 7, wherein said plurality of projections are separately arranged from each other so as to contact with the lower surface of said wafer in substantially equal distribution.

9. A susceptor according to claim 7, wherein said plurality of projections include a plurality of radially extended ridges.

10. A susceptor according to claim 7, wherein said plurality of projections include a plurality of sector projections partitioned by a plurality of radially extended grooves.

11. A susceptor according to claim 7, wherein each of said plurality of projections has a cylindrical shape of the same height, a top surface of each of said projections being adapted to contact with only a part of the lower surface of the semiconductor wafer.

* * * * *